US012322462B2

(12) United States Patent
Ji (10) Patent No.: US 12,322,462 B2
(45) Date of Patent: Jun. 3, 2025

(54) PROGRAMMABLE MEMORY AND METHOD FOR DRIVING PROGRAMMABLE MEMORY (71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 187 days.

(21) Appl. No.: 18/155,692

(22) Filed: Jan. 17, 2023

(65) Prior Publication Data

US 2023/0402118 A1 Dec. 14, 2023

Related U.S. Application Data (63) Continuation of application No. PCT/CN2022/105262, filed on Jul. 12, 2022.

(30) Foreign Application Priority Data

Jun. 14, 2022 (CN) .......................... 202210674391.X (51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................. G11C 17/18; G11C 17/16
See application file for complete search history.

(56) References Cited

U.S. PATENT DOCUMENTS

| 2010/0271897 | A1 | 10/2010 | Naritake | |
|---|---|---|---|---|
| 2012/0182782 | A1* | 7/2012 | Kurjanowicz | H10B 20/00 365/94 |
| 2022/0028470 | A1* | 1/2022 | Chang | G11C 17/18 |

FOREIGN PATENT DOCUMENTS

| CN | 103714849 | A | 4/2014 |
|---|---|---|---|
| CN | 103730163 | A | 4/2014 |
| CN | 105243342 | A | 1/2016 |
| CN | 111310394 | A | 6/2020 |
| CN | 112687692 | A | 4/2021 |
| CN | 114664346 | A | 6/2022 |

* cited by examiner

*Primary Examiner* — Mohammed A Bashar
(74) *Attorney, Agent, or Firm* — Syncoda LLC; Feng Ma (57) ABSTRACT

A programmable memory includes a plurality of antifuse cells, a plurality of word lines and a control circuit. The plurality of antifuse cells are arrayed along row and column directions, herein each of the plurality of antifuse cells includes an antifuse and a switching transistor, a first end of the antifuse being connected to a first terminal of the switching transistor. Each of the plurality of word lines is connected to gates of the switching transistors located in a same row. The control circuit is connected to the plurality of word lines, and is configured to provide a first voltage to a word line connected to a target antifuse cell in a program mode, and provide a second voltage to the word line connected to the target antifuse cell in a read mode, herein the first voltage is greater than the second voltage.

12 Claims, 8 Drawing Sheets

PROGRAMMABLE MEMORY AND METHOD FOR DRIVING PROGRAMMABLE MEMORY

CROSS-REFERENCE TO RELATED APPLICATIONS

This is a continuation of International Patent Application No. PCT/CN2022/105262 filed on Jul. 12, 2022, which claims priority to Chinese Patent Application No. 202210674391.X filed on Jun. 14, 2022. The disclosures of the above-referenced applications are hereby incorporated by reference in their entirety.

BACKGROUND

In some implementations, a programmable memory generally includes a plurality of antifuse cells arranged in an array, each of the antifuse cells includes an antifuse and a switching transistor, and a first end of the antifuse is connected to a first terminal of the switching transistor. In some implementations, the antifuse has a risk of being misprogrammed, and the switching transistor is easily broken down.

It is to be noted that the information disclosed in the above background art is only for enhancement of understanding of the background of the disclosure and therefore may include information that does not constitute related art that is already known to those of ordinary skill in the art.

SUMMARY

The disclosure relates to the technical field of storage, and in particular to a programmable memory and a method for driving a programmable memory.

According to a first aspect of the disclosure, there is provided a programmable memory, including: a plurality of antifuse cells, a plurality of word lines and a control circuit. The plurality of antifuse cells are arrayed along row and column directions, herein each of the plurality of antifuse cells includes an antifuse and a switching transistor, a first end of the antifuse being connected to a first terminal of the switching transistor. Each of the plurality of word lines is connected to gates of the switching transistors located in a same row. The control circuit is connected to the plurality of word lines, and is configured to provide a first voltage to a word line connected to a target antifuse cell in a program mode, and provide a second voltage to the word line connected to the target antifuse cell in a read mode, herein the first voltage is greater than the second voltage.

According to a second aspect of the disclosure, there is provided a method for driving a programmable memory. The programmable memory includes a plurality of antifuse cells and a plurality of word lines. The plurality of antifuse cells are arrayed along row and column directions, herein each of the plurality of antifuse cells includes an antifuse and a switching transistor, a first end of the antifuse being connected to a first terminal of the switching transistor. Each of the plurality of word lines is connected to gates of the switching transistors located in a same row. The method includes: providing, in a program mode, a first voltage to a word line connected to a target antifuse cell; and providing, in a read mode, a second voltage to the word line connected to the target antifuse cell; herein the first voltage is greater than the second voltage.

It is to be understood that the above general descriptions and detailed descriptions below are only exemplary and explanatory and not intended to limit the disclosure.

BRIEF DESCRIPTION OF THE DRAWINGS

The drawings, which are incorporated in and constitute a part of this specification, illustrate the embodiments consistent with the disclosure and, together with the specification, serve to explain the principles of the disclosure. Apparently, the drawings described below are only some embodiments of the disclosure, and other drawings can further be obtained by those of ordinary skill in the art according to the drawings without creative work.

DETAILED DESCRIPTION

The exemplary embodiments will now be described more fully with reference to the drawings. The exemplary embodiments, however, can be explain implemented in many forms and should not be construed as limited to the sample set forth herein; rather, these embodiments are provided so that the disclosure will be more thorough and complete, and the concept of the exemplary embodiments will be fully conveyed to the skilled in the art. The same reference numerals in the figures denote the same or similar structures, and thus their detailed description will be omitted.

The terms "a" "an" and "the" are used to mean that there are one or more elements/components/the like; and the terms "comprising" and "having" are used in an open-ended inclusive sense and mean that there may be additional elements/components/the like in addition to the listed elements/components/the like.

Figure 1:
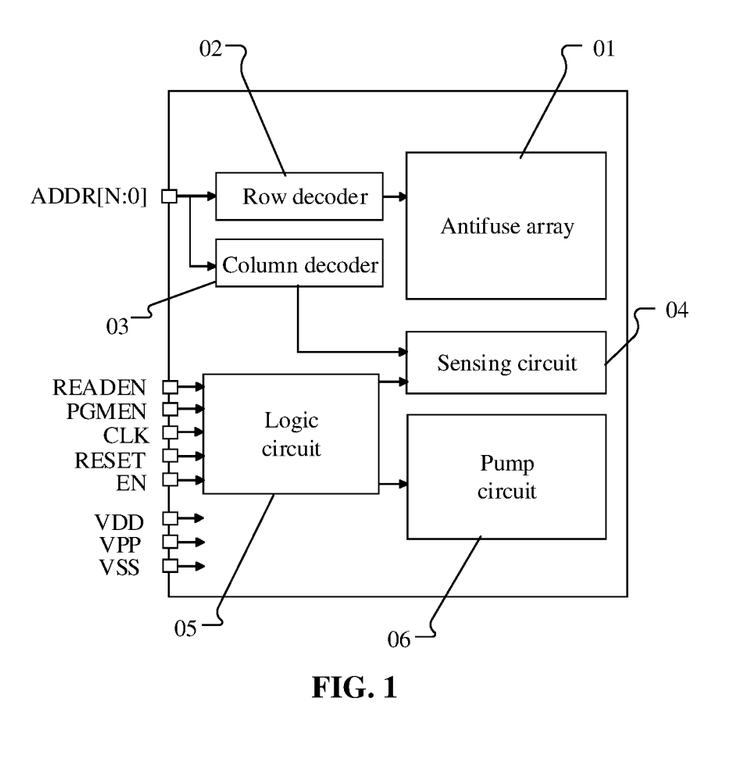
FIG. 1 is a schematic structural diagram of a programmable memory according to an exemplary embodiment of the disclosure.

FIG. 1 is a schematic structural diagram of a programmable memory according to an exemplary embodiment of the disclosure. The programmable memory may include an antifuse array 01, a row decoder 02, a column decoder 03, a sensing circuit 04, a logic circuit 05, and a pump circuit 06. The row decoder 02 is configured to latch and decode row address information of the antifuse array 01. The column decoder 03 is configured to latch and decode column address information of the antifuse array 01. The pump circuit 06 is configured to generate a high voltage to program a fuse. The sensing circuit 04 is configured to detect and determine information stored in a fuse cell in a read mode. The logic circuit 05 is configured to perform coordinated control on various operations, such as switching control between different modes, addressing control of an antifuse cell, read control of state of an antifuse, enable control of a high voltage circuit, etc.

Figure 2:
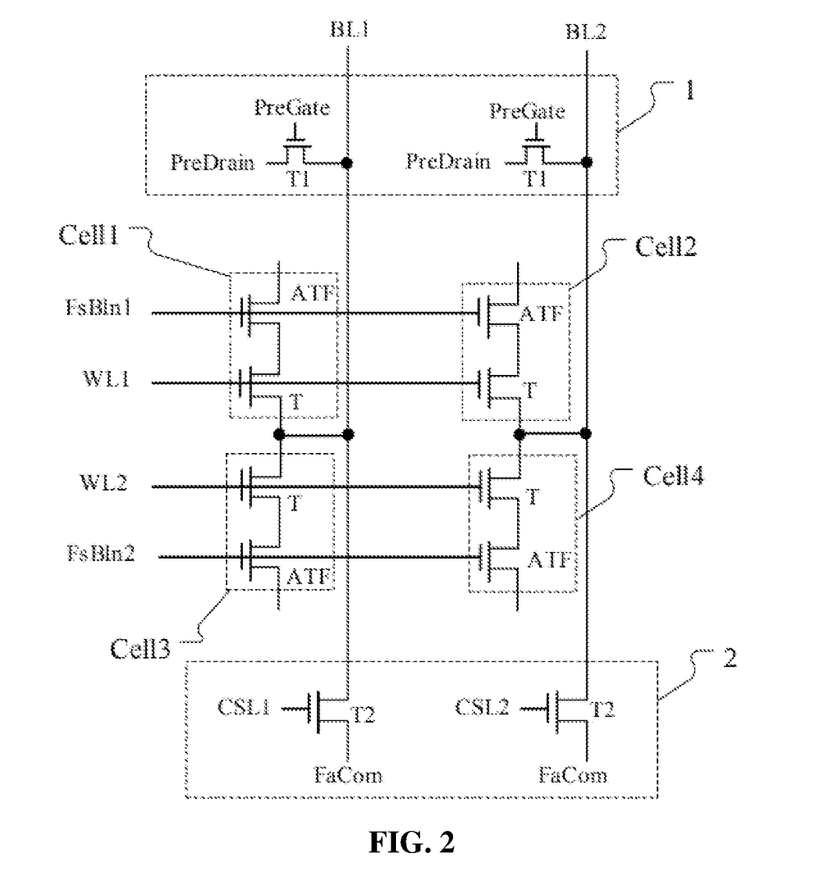
FIG. 2 is a schematic structural diagram of an antifuse array in a programmable memory according to an exemplary embodiment of the disclosure.

FIG. 2 is a schematic structural diagram of an antifuse array in a programmable memory according to an exemplary embodiment of the disclosure. As shown in FIG. 2, the antifuse array includes a plurality of antifuse cells, namely, Cell 1, Cell 2, Cell 3 and Cell 4. The plurality of antifuse cells, namely, Cell 1, Cell 2, Cell 3 and Cell 4 are arrayed along row and column directions. Each of the antifuse cells may include an antifuse ATF and a switching transistor T, and a first end of the antifuse ATF is connected to a first terminal of the switching transistor T. The programmable memory may further include a plurality of bit lines, namely, BL1 and BL2, a plurality of word lines, namely, WL1 and WL2, a plurality of fusing lines, namely, FsBln1 and FsBln2, and a column selection circuit 2. The switching transistor T may be an N-type transistor. It should be understood that in other exemplary embodiments, the switching transistor T may also be a P-type transistor.

As shown in FIG. 2, one bit line is correspondingly arranged to one column of antifuse cells, second terminals of the switching transistors T in the same column of antifuse cells are connected to the corresponding bit line. One word line is correspondingly arranged to one column of antifuse cells, and gates of the switching transistors T in the same row of antifuse cells are connected to the corresponding word line. One fusing line is correspondingly arranged to one row of antifuse cells, and second ends of the antifuses ATF in the same row of antifuse cells are connected to the corresponding fusing lines. It is to be noted that in the exemplary embodiment, the number of the antifuse cell can be multiple, and only four antifuse cells in a two-by-two array distribution are shown in the exemplary embodiment.

In the exemplary embodiment, a method for driving a programmable memory may include a program mode and a read mode. In the program mode, the antifuse in the target antifuse cell needs to be fused; and in the read mode, a signal in the target antifuse cell needs to be read. In the present exemplary embodiment, the program mode and the read mode of the programmable memory are described with the antifuse cell Cell 3 as the target antifuse cell as an example.

As shown in FIG. 2, in the program mode, the word line WL2 is used to conduct the switching transistor T in the target antifuse cell Cell 3, the voltage of the word line WL2 may be 1.2-1.5 V, and the column selection circuit 2 is used to pull down the voltage of the bit line BL1 connected to the target antifuse cell Cell 3 according to a column selection signal. In addition, a high-level signal is input to a second end of the antifuse ATF in the target antifuse cell Cell 3 through the fusing line FsBln2, and the voltage of the fusing line FsBln2 may be 5-6 V, for example, the voltage of the fusing line FsBln2 may be 5 V, 5.5 V, 6 V and the like, so that a high voltage difference is formed at two ends of the antifuse ATF in the target antifuse cell Cell 3, and the voltage difference at two ends of the antifuse ATF can reach 5-6 V, for example, the voltage difference between two ends of the antifuse ATF can reach 5 V, 5.5 V and 6 V. An insulating layer between two ends of the antifuse ATF is fused under action of high voltage, so that two ends of the antifuse ATF in the target antifuse cell Cell 3 are connected. In the read mode, the word line WL2 is used to conduct the switching transistor T in the target antifuse cell Cell 3, the voltage of the word line WL2 at the moment can be the same as the voltage thereof in the program mode. Further, the fusing line FsBln2 is used to output a low-level signal, and whether the antifuse ATF in the target antifuse cell Cell 3 is fused or not can be determined by detecting a signal on the bit line BL1.

In an exemplary embodiment, the column selection circuit 2 may include a plurality of second switches T2, which are arranged in one-to-one correspondence with the plurality of bit lines. A first end of the second switch T2 can be connected to a bit line corresponding the second switch T2, a second end of the second switch T2 can be connected to a low-level voltage end FaCom, and a control end of the second switch T2 can be connected to a column selection signal end. For example, the control end of the second switch T2 corresponding to the bit line BL1 is connected to a column selection signal end CSL1, and a control end of a second switch T2 corresponding to the bit line BL2 is connected to a column selection signal end CSL2. The low-level voltage end FaCom may be configured to output a low-level voltage, and the column selection signal end may be configured to output the column selection signal. The effective level is a level at which the target circuit is conducted. For example, when the second switch T2 is an N-type transistor, the effective level is a high level, and when the second switch T2 is a P-type transistor, the effective level is a low level.

In the present exemplary embodiment, in order to prevent a non-target antifuse cell Cell 4 from being mis-programmed in the program mode, as shown in FIG. 2, the programmable memory in the present embodiment may further include a precharge circuit 1. The precharge circuit 1 may be connected to the plurality of bit lines, namely, BL1 and BL2, and may be configured to provide a precharge voltage to the bit lines in the program mode. Before the column selection circuit 2 pulls down voltage of the bit line BL1 connected to the target antifuse cell Cell 3, the precharge circuit 1 may be used to provide the precharge voltage to all the bit lines. The precharge voltage may be at high level, such as 2-3 V. This arrangement may reduce the voltage at two ends of the antifuse ATF in the non-target antifuse cell (e.g., Cell 4) in the program mode, thereby reducing the risk of the non-target antifuse cell Cell 4 being mis-programmed.

In the exemplary embodiment, as shown in FIG. 2, the precharge circuit 1 may include: a plurality of first switches T1, which are arranged in one-to-one correspondence with the plurality of bit lines. A first end of the first switch T1 is connected to a bit line corresponding to the first switch T1, a second end of the first switch T1 is connected to a precharge voltage end PreDrain, and a control end of the first switch T1 is connected to a precharge signal end PreGate. The precharge voltage end PreDrain is configured to output the precharge voltage, and the precharge signal end PreGate may be configured to output an effective level in the program mode so as to conduct the first switch T1. The first switch T1 may be a N-type transistor or a P-type transistor. It should be understood that in other exemplary embodiments, the precharge circuit 1 may also have other configurations, for example, the precharge circuit 1 may include only one switch having a first end connected to the precharge voltage end, a second end connected to all bit lines, and a control end connected to the precharge signal end.

In order to reduce the area of the antifuse cell and reduce the manufacturing cost of a chip, the switching transistor T in the exemplary embodiment can be a thin gate oxide transistor. However, since the thin gate oxide transistor has a small breakdown voltage, in order to guarantee the reliability of the programmable memory, the present exemplary embodiment needs to reduce the turn-on voltage of the switching transistor T in the antifuse cell. However, reducing the turn-on voltage of the switching transistor T in the antifuse cell may cause that the conduction of the switching transistor T is not thorough and the voltage on the bit line cannot be completely transmitted to the first end of the antifuse ATF, so that the voltage difference between two ends of the antifuse in the non-target antifuse cell is large, and finally the non-target antifuse cell is mis-programmed.

Figure 3:
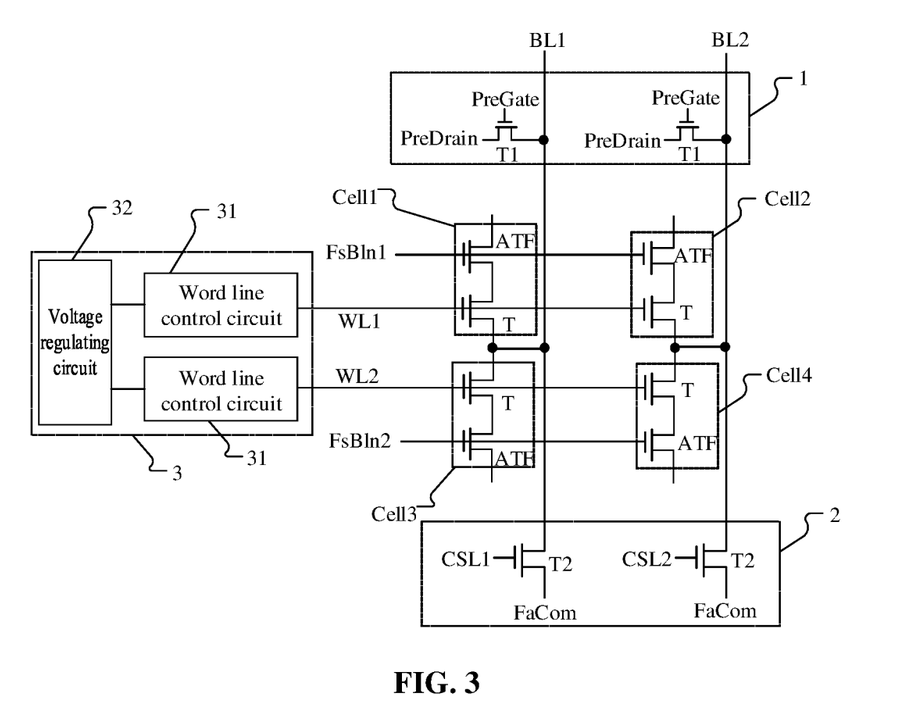
FIG. 3 is a schematic structural diagram of a programmable memory according to another exemplary embodiment of the disclosure.

Based thereon, the exemplary embodiments provide another programmable memory, and FIG. 3 is a schematic structural diagram of a programmable memory according to another exemplary embodiment of the disclosure. Compared with the programmable memory shown in FIG. 2, the programmable memory shown in FIG. 3 may further includes: a control circuit 3, which may be connected to the word lines W1 and W2, the control circuit 3 may be configured to provide a first voltage to a word line connected to a target antifuse cell in a program mode, and provide a second voltage to the word line connected to the target antifuse cell in a read mode, herein the first voltage is greater than the second voltage.

In the exemplary embodiment, the control circuit 3 can fully conduct the switching transistor T in the antifuse cell by using a large first voltage in the program mode, and the precharge voltage on the bit line can be fully transmitted to the first end of the antifuse ATF, so that the voltage difference between two ends of a non-programming target antifuse can be reduced, and therefore, the risk that the non-programming target antifuse is mis-programmed is reduced. Furthermore, the control circuit 3 can also conduct the switching transistor T in the antifuse cell by using a small second voltage in the read mode, so that the risk that the switching transistor is broken down is reduced.

In the exemplary embodiment, the first voltage may be 2.5-3 V, for example, the first voltage may be 2.5 V, 2.7 V, 3 V, or the like. The second voltage may be 1.2-1.5 V, for example, the second voltage may be 1.2 V, 1.3 V, 1.4 V, 1.5 V or the like. The precharge voltage may be 2-2.5 V, for example, the precharge voltage may be 2 V, 2.3 V, 2.5 V, or the like.

In the exemplary embodiment, as shown in FIG. 3, the control circuit 3 may include: a plurality of word line control circuits 31 and a voltage regulating circuit 32. The plurality of word line control circuits 31 are arranged in one-to-one correspondence with the plurality of word lines WL1 and WL2, and are configured to transmit, according to a word line address signal, a power supply voltage to the word line WL2 connected to the target antifuse cell Cell 3. The voltage regulating circuit 32 may be configured to provide the power supply voltage to the word line control circuits 31. The power supply voltage is the first voltage in the program mode, and the power supply voltage is the second voltage in the read mode.

Figure 4:
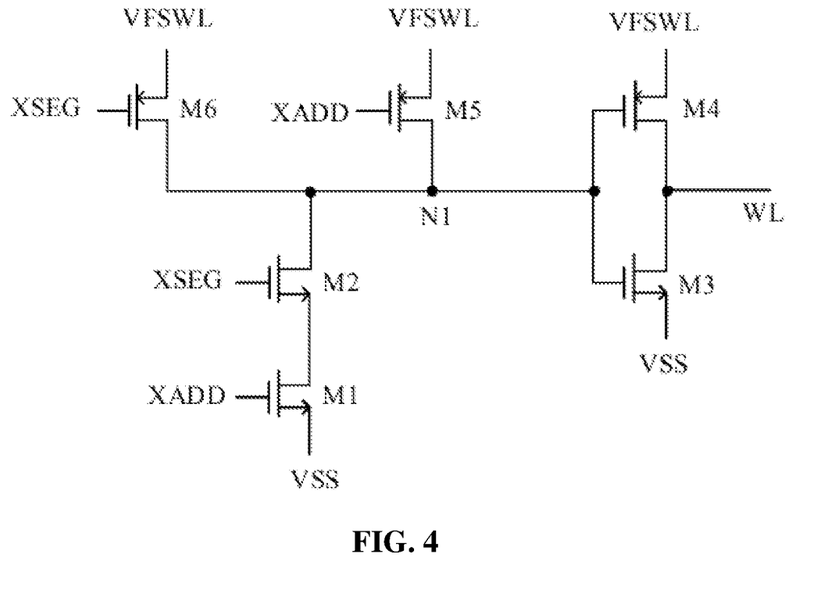
FIG. 4 is a schematic structural diagram of a word line control circuit in a programmable memory according to an exemplary embodiment of the disclosure.

FIG. 4 is a schematic structural diagram of a word line control circuit in a programmable memory according to an exemplary embodiment of the disclosure. The word line control circuit includes: a first N-type transistor M1, a second N-type transistor M2, a third N-type transistor M3, a fourth P-type transistor M4, a fifth P-type transistor M5 and a sixth P-type transistor M6. A first terminal of the first N-type transistor M1 is connected to a low-level signal end VSS, and a gate of the first N-type transistor M1 is connected to a first address signal end XADD. A first terminal of the second N-type transistor is connected to a second terminal of the first N-type transistor, a second terminal of the second N-type transistor M2 is connected to a first node N1, and a gate of the second N-type transistor M2 is connected to a second address signal end XSEG. A first terminal of the third N-type transistor M3 is connected to a low-level signal end VSS, a second terminal of the third N-type transistor M3 is connected to a word line WL corresponding to the word line control circuit, and a gate of the third N-type transistor M3 is connected to the first node N1. A first terminal of the fourth P-type transistor M4 is connected to a power supply voltage end VFSWL, a second terminal of the fourth P-type transistor M4 is connected to the word line WL, and a gate of the fourth P-type transistor M4 is connected to the first node N1. A first terminal of the fifth P-type transistor M5 is connected to a power supply voltage end VFSW, a second terminal of the fifth P-type transistor M5 is connected to the first node N1, and a gate of the fifth P-type transistor M5 is connected to a first address signal end XADD. A first terminal of the sixth P-type transistor is connected to the power supply voltage end VFSW, a second terminal of the sixth P-type transistor M6 is connected to the first node N1, and a gate of the sixth P-type transistor M6 is connected to a second address signal end XSEG.

The word line address signal may include a first address signal and a second address signal, the first address signal end XADD is configured to output the first address signal, the second address signal end XSEG is configured to output the second address signal, the power supply voltage end VFSW is configured to output power supply voltage, and the low level signal end VSS can be a ground end.

The word line control circuit inputs power supply voltage to the corresponding word line WL through the power supply voltage end VFSW only when the first address signal and the second address signal are both at high levels. It should be understood that in other exemplary embodiments, the word line control circuit may also have other configurations, for example, in FIG. 4, the first terminal of the fifth P-type transistor M5 and the first terminal of the sixth P-type transistor M6 may also be connected to other high-level signal ends.

In the exemplary embodiment, the antifuse array may be divided into a plurality of subarrays, and each subarray may include a plurality of antifuse cells arranged in an array. In the exemplary embodiment, the second address signal may be a subarray address signal, that is, the second address signal may be configured to characterize the address of a certain subarray. The first address signal may be a row address signal, that is, the first address signal may be configured to characterize a row of antifuse cells in the subarray. In the exemplary embodiment, the subarray can be limited through the second address signal, and then a certain row of antifuse cells in the subarray can be determined through the first address signal, so that the information amount of the address signal can be reduced, and the transmission speed of the address signal can be improved.

Figure 5:
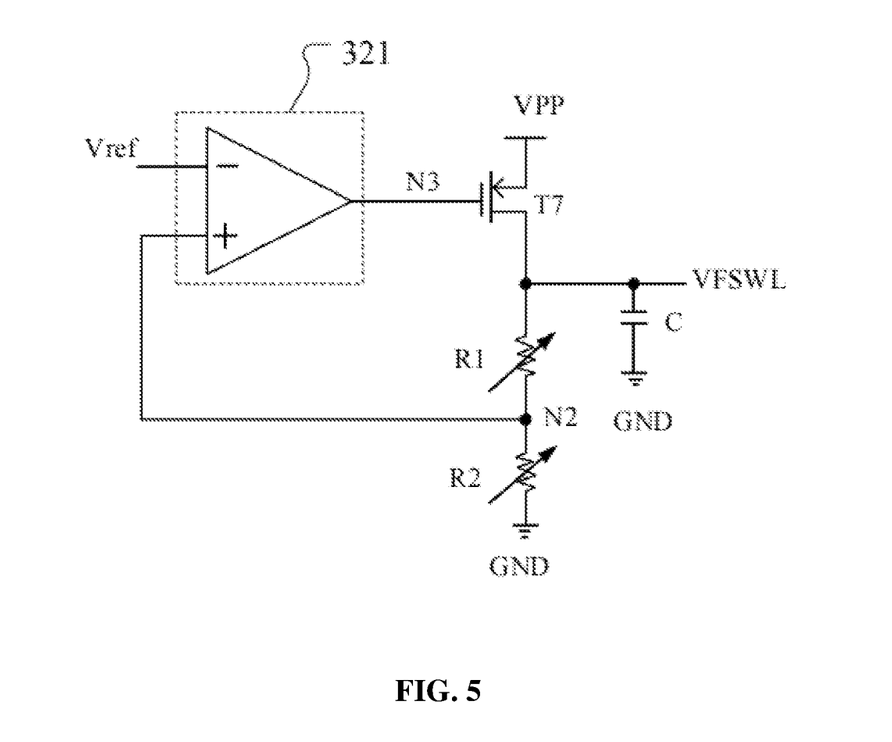
FIG. 5 is a schematic structural diagram of a voltage regulating circuit in a programmable memory according to an exemplary embodiment of the disclosure.

FIG. 5 is a schematic structural diagram of a voltage regulating circuit in a programmable memory according to an exemplary embodiment of the disclosure. The voltage regulating circuit may include: a comparator 321, a seventh P-type transistor M7, a first variable resistor R1, a second variable resistor R2 and an adjusting circuit (not shown). An inverting input end of the comparator 321 is connected to a reference voltage end Vref, a non-inverting input end of the comparator 321 is connected to a second node N2, and an output end of the comparator 321 is connected to a third node N3. A first terminal of the seventh P-type transistor M7 is connected to a power supply end VPP, a second terminal of the seventh P-type transistor M7 may be connected to the power supply voltage end VFSW, and a gate of the seventh P-type transistor M7 is connected to the third node N3. The first variable resistor R1 is connected between the second terminal of the seventh P-type transistor M7 and the second node N2. The second variable resistor R2 is connected between the second node N2 and a ground end GND. The adjusting circuit is configured to adjust, according to a program flag signal, at least one of the reference voltage, the first variable resistor, or the second variable resistor.

In the voltage regulating circuit, the comparator 321 amplifies the voltage difference between the non-inverting input end and the inverting input end thereof and inputs the amplified voltage difference to the third node N3. The third node N3 controls the seventh P-type transistor M7 to output current so as to provide power supply voltage to the power supply voltage end VFSW. According to the principle of virtual short circuit, the voltage of the non-inverting input end and the voltage of the inverting input end of the comparator 321 are the same in a steady state, that is, the voltage of the reference voltage end Vref is the same as the voltage of the second node N2 in the steady state. The power supply voltage Vf at the power supply voltage end VFSW= (R1+R2) Vref/R2, where R1 is the resistance of the first variable resistor R1, R2 is the resistance of the second variable resistor R2, and Vref is the voltage of the reference voltage end Vref Therefore, in the exemplary embodiment, the adjusting circuit can adjust, according to the programming mark signal, the voltage of the power supply voltage end VFSW by adjusting at least one of the reference voltage, the first variable resistor and the second variable resistor. For example, when the programmable memory enters the program mode, the program flag signal is at a high level, and the adjusting circuit can control the power supply voltage end VFSW to output a first voltage; and when the programmable memory enters the read mode, the program flag signal is at a low level, and the adjusting circuit can control the power supply voltage end VFSW to output a second voltage.

In the exemplary embodiment, as shown in FIG. 5, the voltage regulating circuit may further include a capacitor C connected between the power supply voltage end VFSW and the ground end GND, and the capacitor C may compensate a left half-plane zero point for the system to improve the stability of the system.

Figure 6:
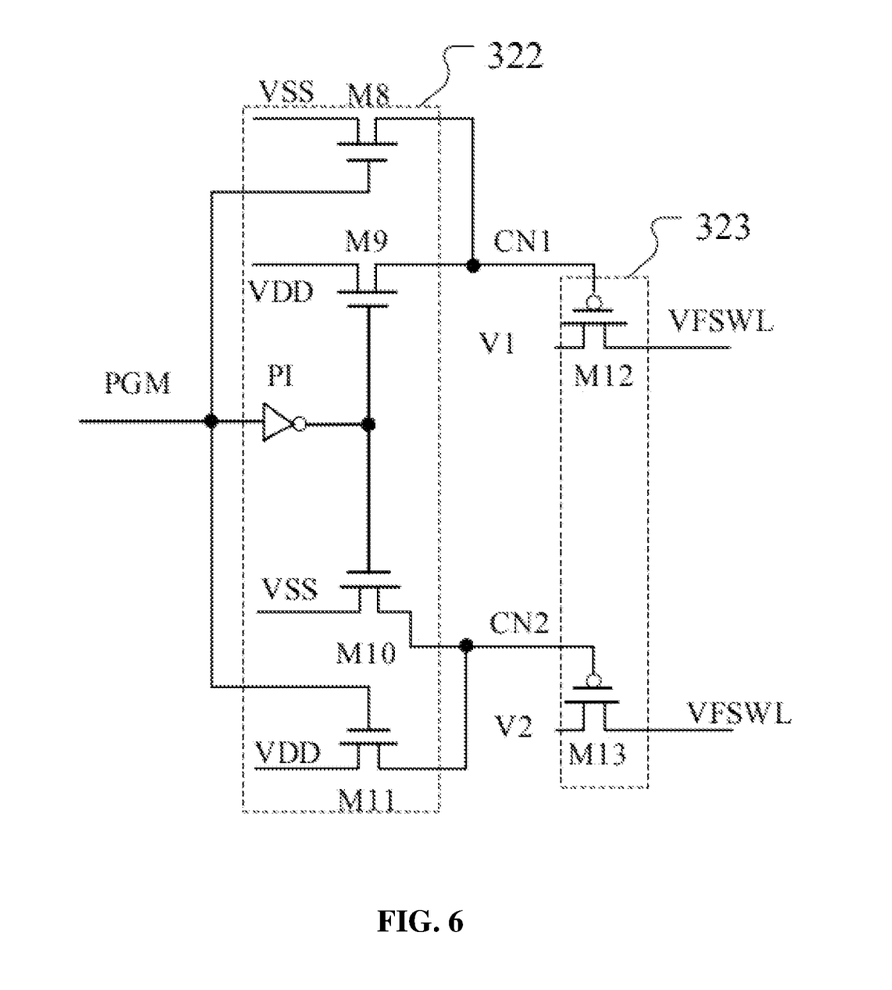
FIG. 6 is a schematic structural diagram of a voltage regulating circuit in a programmable memory according to another exemplary embodiment of the disclosure.

It should be understood that in other exemplary embodiments, the voltage regulating circuit may also have other configurations. For example, FIG. 6 is a schematic structural diagram of a voltage regulating circuit in a programmable memory according to another exemplary embodiment of the disclosure. The voltage regulating circuit includes: a control signal generation circuit 322 and a voltage selection circuit 323. The control signal generation circuit 322 is configured to output, according to a program flag signal PGM, a first control signal CN1 or a second control signal CN2. The voltage selection circuit 323 is configured to receive the first control signal CN1 or the second control signal CN2, and output, according to the first control signal CN1, the first voltage to the word line control circuits 31, or output, according to the second control signal CN2, the second voltage to the word line control circuits 31.

In the exemplary embodiment, as shown in FIG. 6, the control signal generation circuit 322 may include: an eighth N-type transistor M8, an inverter PI, a ninth N-type transistor M9, a tenth N-type transistor M10 and an eleventh N-type transistor M11. A first terminal of the eighth N-type transistor M8 is connected to a low-level signal end VSS, a gate of the eighth N-type transistor M8 is configured to receive the program flag signal PGM, and a second terminal of the eighth N-type transistor M8 is configured to output the first control signal CN1. An input end of the inverter PI is configured to receive the program flag signal PGM. A first terminal of the ninth N-type transistor M9 is connected to a high-level signal end VDD, a gate of the ninth N-type transistor M9 is connected to an output end of the inverter PI, and a second terminal of the ninth N-type transistor M9 is connected to the second terminal of the eighth N-type transistor M8. A first terminal of the tenth N-type transistor M10 is connected to the low-level signal end VSS, a gate of the tenth N-type transistor M10 is connected to the output end of the inverter PI, and a second terminal of the tenth N-type transistor M10 is configured to output the second control signal CN2. A first terminal of the eleventh N-type transistor M11 is connected to a high-level signal end VDD, a gate of the eleventh N-type transistor M11 is configured to receive the program flag signal PGM, and a second terminal of the eleventh N-type transistor M11 is connected to the second terminal of the tenth N-type transistor M10. The voltage selection circuit includes: a twelfth P-type transistor M12 and a thirteenth P-type transistor M13. A first terminal of the twelfth P-type transistor M12 is configured to receive the first voltage V1, a gate of the twelfth P-type transistor M12 is connected to the second terminal of the eighth N-type transistor M8 and is configured to receive the first control signal CN1, and a second terminal of the twelfth P-type transistor M12 is connected to a power supply voltage end VFSWL. A first terminal of the thirteenth P-type transistor M13 is configured to receive the second voltage V2, a gate of the thirteenth P-type transistor M13 is connected to the second terminal of the tenth N-type transistor M10 and receive the second control signal CN2, and a second terminal of the thirteenth P-type transistor M13 is connected to the power supply voltage end VFSWL. The power supply voltage end VFSWL is configured to output power supply voltage.

Figure 7:
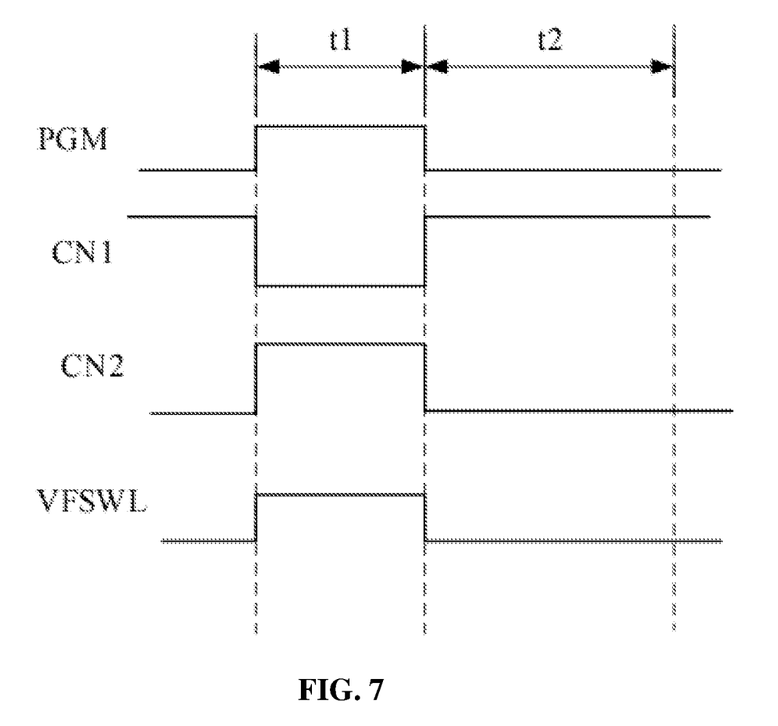
FIG. 7 is a timing diagram of signals in FIG. 6.

FIG. 7 is a timing diagram of signals in FIG. 6. PGM is a timing diagram of a programming mark signal, CN1 is a timing diagram of a first control signal, CN2 is a timing diagram of a second control signal, and VFSWL is a timing diagram of a power supply voltage. At the program mode stage t1, the program flag signal is at a high level, in such a case, the eighth N-type transistor M8 is turned on, the ninth N-type transistor M9 is turned off, the first control signal CN1 is at a low level, and the first control signal CN1 turns on the twelfth P-type transistor M12 to transmit the first voltage of the first voltage end V1 to the power supply voltage end VFSWL. Further, the tenth N-type transistor M10 is turned off, the eleventh N-type transistor M11 is turned on, and in such a case, the second control signal CN2 is at a high level, and the thirteenth P-type transistor M13 is turned off. At the read mode stage t2, the program flag signal is at a low level, in such a case, the tenth N-type transistor M10 is turned on, the eleventh N-type transistor M11 is turned off, the second control signal is at a low level, and the second control signal CN2 turns on the thirteenth P-type transistor M13 to transmit the second voltage of the second voltage end V2 to the power supply voltage end VFSWL. Further, the eighth N-type transistor M8 is turned off, the ninth N-type transistor M9 is turned on, the first control signal CN1 is at a high level, and the twelfth P-type transistor M12 is turned off. It is to be noted that when the program marker signal is at a high level, the difference between the potential of the program flag signal and the potential of the high-level signal end VDD needs to be greater than threshold voltages of the eighth N-type transistor M8 and the eleventh N-type transistor M11, and the voltage of the high-level signal end VDD needs to be greater than the first voltage and the second voltage.

Figure 8:
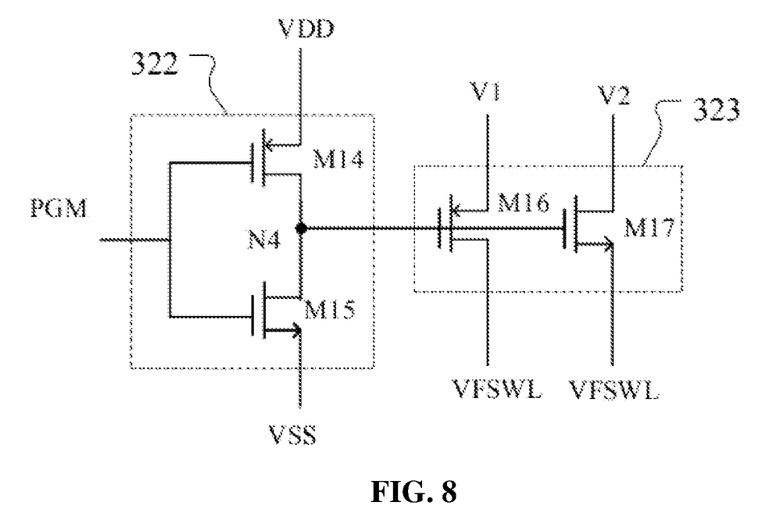
FIG. 8 is a schematic structural diagram of a voltage regulating circuit in a programmable memory according to another exemplary embodiment of the disclosure.

FIG. 8 is a schematic structural diagram of a voltage regulating circuit in a programmable memory according to another exemplary embodiment of the disclosure. The voltage regulating circuit may also include: a control signal generation circuit 322, and a voltage selection circuit 323. The control signal generation circuit 322 may include a fourteenth P-type transistor M14, a fifteenth N-type transistor M15, a first terminal of the fourteenth P-type transistor M14 is connected to the high-level signal end VDD, a second terminal of the fourteenth P-type transistor M14 is connected to a fourth node N4, and a gate of the fourteenth P-type transistor M14 is configured to receive the program flag signal PGM. A first terminal of the fifteenth N-type transistor M15 is connected to the low-level signal end VSS, a second terminal of the fifteenth N-type transistor M15 is connected to the fourth node N4, and a gate of the fifteenth N-type transistor M15 is configured to receive the program flag signal. The voltage selection circuit 323 may include a sixteenth P-type transistor M16 and a seventeenth N-type transistor M17. A first terminal of the sixteenth P-type transistor M16 is connected to the first voltage end V1, a second terminal of the sixteenth P-type transistor M16 is connected to the power supply voltage end VFSWL, and a gate of the sixteenth P-type transistor M16 is connected to the fourth node N4. A first terminal of the seventeenth N-type transistor M17 is connected to the second voltage end V2, a second terminal of the seventeenth N-type transistor M17 is connected to the power supply voltage end VFSWL, and a gate of the seventeenth N-type transistor M17 is configured to the fourth node N4. In the program mode, the program flag signal is at a high level, the fifteenth N-type transistor M15 is turned on, the fourth node N4 is at a low level, the sixteenth P-type transistor M16 is turned on, and the first voltage end V1 inputs the first voltage to the power supply voltage end VFSWL. In the read mode, the program flag signal is at a low level, the fourteenth P-type transistor M14 is turned on, the fourth node N4 is at a high level, the seventeenth N-type transistor M17 is turned on, and the second voltage tend V2 inputs the second voltage to the power supply voltage end VFSWL. It is to be noted that, in the exemplary embodiment, the voltage of the high-level signal end VDD minus the voltage of the second voltage end V2 may be greater than the threshold voltage of the seventeenth N-type transistor M17, so that the seventeenth N-type transistor M17 is fully turned on in the read mode; and the voltage of the high-level signal end VDD may be equal to or greater than the voltage of the first voltage end V1, so that the sixteenth P-type transistor is completely turned off in the read mode.

The exemplary embodiments of the disclosure further provide a method for driving a programmable memory, the programmable memory including a plurality of antifuse cells and a plurality of word lines.

The plurality of antifuse cells are arrayed along row and column directions, herein each of the plurality of antifuse cells includes an antifuse and a switching transistor, a first end of the antifuse being connected to a first terminal of the switching transistor.

Each of the plurality of word lines is connected to gates of the switching transistors located in a same row.

The method further includes the following operations.

A first voltage is provided to connect, in a program mode, to a word line connected to a target antifuse cell.

A second voltage is provided to connect, in a read mode, the word line connected to the target antifuse cell.

The first voltage is greater than the second voltage.

Other embodiments of the disclosure will be apparent to the skilled in the art from consideration of the specification and practice of the disclosure disclosed here. This application is intended to cover any variations, uses, or adaptations of the disclosure following the general principles thereof and including common general knowledge or customary technical means in the technical field not disclosed by the present disclosure. The specification and embodiments are considered as exemplary only, with a true scope and spirit of the disclosure being indicated by the following claims.

It will be appreciated that the disclosure is not limited to the exact construction that has been described above and illustrated in the drawings, and that various modifications and changes may be made without departing from the scope thereof. The scope of the disclosure is only limited by the appended claims.

What is claimed is:

1. A programmable memory, comprising:
    a plurality of antifuse cells, arrayed along row and column directions, wherein each of the plurality of antifuse cells comprises an antifuse and a switching transistor, a first end of the antifuse being connected to a first terminal of the switching transistor;
    a plurality of word lines, wherein each of the plurality of word lines is connected to gates of the switching transistors located in a same row; and
    a control circuit, connected to the plurality of word lines, and configured to provide a first voltage to a word line connected to a target antifuse cell in a program mode, and provide a second voltage to the word line connected to the target antifuse cell in a read mode,
    wherein the first voltage is greater than the second voltage;
    wherein the control circuit comprises:
    a plurality of word line control circuits arranged in one-to-one correspondence with the plurality of word lines, wherein the word line control circuit is configured to transmit, according to a word line address signal, a power supply voltage to the word line connected to the target antifuse cell; and
    a voltage regulating circuit, configured to provide the power supply voltage to the word line control circuits, wherein the power supply voltage is the first voltage in the program mode, and the power supply voltage is the second voltage in the read mode;
    wherein the voltage regulating circuit comprises:
    a comparator, wherein an inverting input end of the comparator is configured to receive a reference voltage, a non-inverting input end of the comparator is connected to a second node, and an output end of the comparator is connected to a third node;
    a seventh P-type transistor, wherein a first terminal of the seventh P-type transistor is connected to a power supply end, a second terminal of the seventh P-type transistor is configured to output the power supply voltage, and a gate of the seventh P-type transistor is connected to the third node;
    a first variable resistor, connected between the second terminal of the seventh P-type transistor and the second node;
    a second variable resistor, connected between the second node and a ground end; and
    an adjusting circuit, configured to adjust, according to a program flag signal, at least one of the reference voltage, the first variable resistor, or the second variable resistor.

2. The programmable memory of claim 1, further comprising:
   a plurality of bit lines, wherein each of the plurality of bit lines is connected to second terminals of the switching transistors located in a same column; and
   a precharge circuit, connected to the plurality of bit lines, and configured to provide a precharge voltage to the plurality of bit lines in the program mode.

3. The programmable memory of claim 2, wherein the precharge circuit comprises:
   a plurality of first switches arranged in one-to-one correspondence with the plurality of bit lines, wherein the first switch has a first end connected to a bit line corresponding to the first switch, a second end configured to receive the precharge voltage, and a control end connected to a precharge signal end, the precharge signal end being for outputting an effective level in the program mode.

4. The programmable memory of claim 2, further comprising:
   a column selection circuit, connected to the plurality of bit lines, and configured to pull down, according to a column selection signal, a voltage of a bit line connected to the target antifuse cell in the program mode.

5. The programmable memory of claim 4, wherein the column selection circuit comprises:
   a plurality of second switches arranged in one-to-one correspondence with the plurality of bit lines, wherein the second switch has a first end connected to a bit line corresponding to the second switch, a second end configured to receive a low-level voltage, and a control end configured to receive the column selection signal.

6. The programmable memory of claim 1, wherein the word line address signal comprises a first address signal and a second address signal, and the word line control circuit comprises:
   a first N-type transistor, wherein a first terminal of the first N-type transistor is grounded, and a gate of the first N-type transistor is configured to receive the first address signal;
   a second N-type transistor, wherein a first terminal of the second N-type transistor is connected to a second terminal of the first N-type transistor, a second terminal of the second N-type transistor is connected to a first node, and a gate of the second N-type transistor is configured to receive the second address signal;
   a third N-type transistor, wherein a first terminal of the third N-type transistor is grounded, a second terminal of the third N-type transistor is connected to a word line corresponding to the word line control circuit, and a gate of the third N-type transistor is connected to the first node;
   a fourth P-type transistor, wherein a first terminal of the fourth P-type transistor is configured to receive the power supply voltage, a second terminal of the fourth P-type transistor is connected to the word line corresponding to the word line control circuit, and a gate of the fourth P-type transistor is connected to the first node;
   a fifth P-type transistor, wherein a first terminal of the fifth P-type transistor is configured to receive the power supply voltage, a second terminal of the fifth P-type transistor is connected to the first node, and a gate of the fifth P-type transistor is configured to receive the first address signal; and
   a sixth P-type transistor, wherein a first terminal of the sixth P-type transistor is configured to receive the power supply voltage, a second terminal of the sixth P-type transistor is connected to the first node, and a gate of the sixth P-type transistor is configured to receive the second address signal.

7. The programmable memory of claim 6, wherein the first address signal is a row address signal, and the second address signal is a subarray address signal.

8. The programmable memory of claim 1, wherein the voltage regulating circuit comprises:
   a control signal generation circuit, configured to output, according to a program flag signal, a first control signal or a second control signal; and
   a voltage selection circuit, configured to:
   receive the first control signal or the second control signal; and
   output, according to the first control signal, the first voltage to the word line control circuits, or output, according to the second control signal, the second voltage to the word line control circuits.

9. The programmable memory of claim 8, wherein the control signal generation circuit comprises:
   an eighth N-type transistor, wherein a first terminal of the eighth N-type transistor is connected to a low-level signal end, a gate of the eighth N-type transistor is configured to receive the program flag signal, and a second terminal of the eighth N-type transistor is configured to output the first control signal;
   an inverter, wherein an input end of the inverter is configured to receive the program flag signal;
   a ninth N-type transistor, wherein a first terminal of the ninth N-type transistor is connected to a high-level signal end, a gate of the ninth N-type transistor is connected to an output end of the inverter, and a second terminal of the ninth N-type transistor is connected to the second terminal of the eighth N-type transistor;
   a tenth N-type transistor, wherein a first terminal of the tenth N-type transistor is connected to the low-level signal end, a gate of the tenth N-type transistor is connected to the output end of the inverter, and a second terminal of the tenth N-type transistor is configured to output the second control signal; and
   an eleventh N-type transistor, wherein a first terminal of the eleventh N-type transistor is connected to the high-level signal end, a gate of the eleventh N-type transistor is configured to receive the program flag signal, and a second terminal of the eleventh N-type transistor is connected to the second terminal of the tenth N-type transistor;
   and the voltage selection circuit comprises:
   a twelfth P-type transistor, wherein a first terminal of the twelfth P-type transistor is configured to receive the first voltage, a gate of the twelfth P-type transistor is connected to the second terminal of the eighth N-type transistor and the second terminal of the ninth N-type transistor, and a second terminal of the twelfth P-type transistor is configured to output the power supply voltage; and
   a thirteenth P-type transistor, wherein a first terminal of the thirteenth P-type transistor is configured to receive the second voltage, a gate of the thirteenth P-type transistor is connected to the second terminal of the tenth N-type transistor and the second terminal of the eleventh N-type transistor, and a second terminal of the thirteenth P-type transistor is configured to output the power supply voltage.

10. A method for driving a programmable memory, wherein the programmable memory comprises:

a plurality of antifuse cells, arrayed along row and column directions, wherein each of the plurality of antifuse cells comprises an antifuse and a switching transistor, a first end of the antifuse being connected to a first terminal of the switching transistor;

a plurality of word lines, wherein each of the plurality of word lines is connected to gates of the switching transistors located in a same row; and a control circuit, connected to the plurality of word lines, and configured to provide the method;

wherein the control circuit comprises:

a plurality of word line control circuits arranged in one-to-one correspondence with the plurality of word lines, wherein the word line control circuit is configured to transmit, according to a word line address signal, a power supply voltage to the word line connected to the target antifuse cell; and a voltage regulating circuit, configured to provide the power supply voltage to the word line control circuits, wherein the power supply voltage is the first voltage in the program mode, and the power supply voltage is the second voltage in the read mode;

wherein the voltage regulating circuit comprises:

a comparator, wherein an inverting input end of the comparator is configured to receive a reference voltage, a non-inverting input end of the comparator is connected to a second node, and an output end of the comparator is connected to a third node;

a seventh P-type transistor, wherein a first terminal of the seventh P-type transistor is connected to a power supply end, a second terminal of the seventh P-type transistor is configured to output the power supply voltage, and a gate of the seventh P-type transistor is connected to the third node;

a first variable resistor, connected between the second terminal of the seventh P-type transistor and the second node;

a second variable resistor, connected between the second node and a ground end; and an adjusting circuit, configured to adjust, according to a program flag signal, at least one of the reference voltage, the first variable resistor, or the second variable resistor;

and the method comprises:

providing, in a program mode, a first voltage to a word line connected to a target antifuse cell; and providing, in a read mode, a second voltage to the word line connected to the target antifuse cell;

wherein the first voltage is greater than the second voltage.

11. A programmable memory, comprising:

a plurality of antifuse cells, arrayed along row and column directions, wherein each of the plurality of antifuse cells comprises an antifuse and a switching transistor, a first end of the antifuse being connected to a first terminal of the switching transistor;

a plurality of word lines, wherein each of the plurality of word lines is connected to gates of the switching transistors located in a same row; and a control circuit, connected to the plurality of word lines, and configured to provide a first voltage to a word line connected to a target antifuse cell in a program mode, and provide a second voltage to the word line connected to the target antifuse cell in a read mode, wherein the first voltage is greater than the second voltage;

wherein the control circuit comprises:

a plurality of word line control circuits arranged in one-to-one correspondence with the plurality of word lines, wherein the word line control circuit is configured to transmit, according to a word line address signal, a power supply voltage to the word line connected to the target antifuse cell; and a voltage regulating circuit, configured to provide the power supply voltage to the word line control circuits, wherein the power supply voltage is the first voltage in the program mode, and the power supply voltage is the second voltage in the read mode;

wherein the word line address signal comprises a first address signal and a second address signal, and the word line control circuit comprises:

a first N-type transistor, wherein a first terminal of the first N-type transistor is grounded, and a gate of the first N-type transistor is configured to receive the first address signal;

a second N-type transistor, wherein a first terminal of the second N-type transistor is connected to a second terminal of the first N-type transistor, a second terminal of the second N-type transistor is connected to a first node, and a gate of the second N-type transistor is configured to receive the second address signal;

a third N-type transistor, wherein a first terminal of the third N-type transistor is grounded, a second terminal of the third N-type transistor is connected to a word line corresponding to the word line control circuit, and a gate of the third N-type transistor is connected to the first node;

a fourth P-type transistor, wherein a first terminal of the fourth P-type transistor is configured to receive the power supply voltage, a second terminal of the fourth P-type transistor is connected to the word line corresponding to the word line control circuit, and a gate of the fourth P-type transistor is connected to the first node;

a fifth P-type transistor, wherein a first terminal of the fifth P-type transistor is configured to receive the power supply voltage, a second terminal of the fifth P-type transistor is connected to the first node, and a gate of the fifth P-type transistor is configured to receive the first address signal; and a sixth P-type transistor, wherein a first terminal of the sixth P-type transistor is configured to receive the power supply voltage, a second terminal of the sixth P-type transistor is connected to the first node, and a gate of the sixth P-type transistor is configured to receive the second address signal.

12. The programmable memory of claim 11, wherein the first address signal is a row address signal, and the second address signal is a subarray address signal.

* * * * *